(12) United States Patent
Farrar

(10) Patent No.: US 6,426,289 B1
(45) Date of Patent: Jul. 30, 2002

(54) METHOD OF FABRICATING A BARRIER LAYER ASSOCIATED WITH A CONDUCTOR LAYER IN DAMASCENE STRUCTURES

(75) Inventor: Paul A. Farrar, Bluffton, SC (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/534,224

(22) Filed: Mar. 24, 2000

(51) Int. Cl.[7] .............................................. H01L 21/44
(52) U.S. Cl. ...................... 438/670; 438/641; 438/659; 438/674
(58) Field of Search ................................ 438/618, 637, 438/638, 659, 687, 670, 641–644, 652–654, 658, 674, 678

(56) References Cited

U.S. PATENT DOCUMENTS

| | | | | |
|---|---|---|---|---|
| 5,969,422 A | * | 10/1999 | Ting et al. ................... | 257/762 |
| 6,022,808 A | * | 2/2000 | Nogami et al. .............. | 438/694 |
| 6,110,817 A | * | 8/2000 | Tsai et al. ................... | 438/618 |
| 6,111,318 A | * | 8/2000 | Hoshino ...................... | 257/741 |
| 6,117,770 A | * | 9/2000 | Pramanick et al. .......... | 438/659 |
| 6,146,995 A | * | 11/2000 | Ho .............................. | 438/637 |
| 6,147,000 A | * | 11/2000 | You et al. .................... | 438/687 |

* cited by examiner

*Primary Examiner*—Michael Trinh
*Assistant Examiner*—Jamie L. Brophy
(74) *Attorney, Agent, or Firm*—Dickstein Shapiro Morin & Oshinsky LLP

(57) ABSTRACT

The present invention is directed to a simplified, CVD-less method of forming a barrier layer for a metal layer which prevents metal contamination in an integrated circuit. The invention utilizes a sacrificial multilayer dielectric structure and selective etching to form the top barrier layer. An opening is etched in the structure and a plating layer is deposited in the opening. A first unneeded portion of the structure along with an unneeded portion of the plating layer is removed utilizing an etchant that is selective for the first unneeded structural portion. A Cu layer is deposited and implanted with barrier material to form the top barrier layer. A second unneeded portion of the structure along with an unneeded portion of the top barrier layer is removed utilizing an etchant that is selective for the second unneeded structural portion. The resulting structure is a metal interconnect structure having an overlying top barrier layer which is produced without using CVD techniques.

45 Claims, 12 Drawing Sheets

METHOD OF FABRICATING A BARRIER LAYER ASSOCIATED WITH A CONDUCTOR LAYER IN DAMASCENE STRUCTURES

BACKGROUND OF THE INVENTION

1. Field of the Invention

The present invention relates to a method of fabricating a barrier layer and more particularly to a method of fabricating a barrier layer on top surfaces of metals in damascene structures utilizing ion implantation.

2. Description of the Related Art

As the demand increases for cheaper, faster, less power consuming yet more powerful integrated circuits, such as microprocessors and memory devices, the transistor packing density of the integrated circuit must be similarly increased. Very large scale integration (VLSI) techniques are very common place and yet the demand for even more reduced scale devices is ever present. All aspects of the integrated circuit must be scaled down to fully minimize the device dimensions. In addition to minimizing transistor dimensions, one must minimize the dimensions of the electrical interconnections which connect the transistors together on a microchip to form a complete circuit.

Currently, metals such as copper, aluminum, gold and silver, as well as others, are used as conductive materials for electrical interconnections in a VLSI integrated circuit. However, aluminum alloys are most commonly used and its alloys have been fully explored and characterized for use as an electrical interconnection in an integrated circuit, and much technology has been developed to aid in the formation of aluminum interconnections. Aluminum has very attractive features for use as an integrated circuit electrical interconnection, such as low electrical resistivity and strong adhesion to silicon dioxide. However, as VLSI dimensions move into the deep-sub micron Ultra Large Scale Integration (ULSI) arena, the deficiencies of aluminum and its alloys become limiting factors in achieving superior performance. For example, as the width of electrical interconnections becomes narrower, even the low resistance of aluminum becomes non-negligible and begins to slow down the signal speed. Hence, barrier layers are necessary due to decreasing dimensions and design rules become increasingly restricted by aluminum interconnection reliability concerns such as electromigration, stress-induced void formation, hillock suppression, and current density limitations.

Also, the microelectronics industry has recently migrated towards the investigation of more robust and conductive metals for use in interconnection technology, such as Copper (Cu). Cu is approximately 40% lower in resistivity than Al and is much more resistant to reliability problems such as electromigration. Unfortunately, Cu has been known to cause other reliability problems associated with the high rate of Cu diffusion through silicon substrates and dielectric films. One such problem is electrical shorting, wherein the Cu from one Cu interconnect line diffuses into an adjacent dielectric region, forming a conductive path to another Cu interconnect line. Another problem is transistor poisoning, wherein Cu diffuses into the underlying silicon substrate and causes junction leakage along with reduced channel mobility in the transistor, thereby destroying the device. Thus, to implement Cu as an interconnect material it has become necessary to develop methods for preventing Cu from diffusing through layers of a semiconductor device. Hence, various means have been suggested to deal with the problem of copper diffusion into integrated circuit material. Several materials, especially metallic ones, have been suggested for use as barriers to prevent the copper diffusion process. Tungsten, molybdenum, and titanium nitride (TiN) have all been suggested for use as copper diffusion barriers.

However, barriers for these conductive metals cannot be deposited onto substrates, or into vias, using conventional metal deposition processes, such as sputtering, since the geometries of the selected IC features are small. It is impractical to sputter metal to fill small diameter vias, since the gap filling capability is poor. Thus, new deposition processes such as CVD, have been developed for use with these barrier materials in the lines and interconnects of an IC interlevel dielectric. In a typical CVD process, the barrier material is combined with a ligand, or organic compound, to make the barrier material volatile. That is, the barrier material is vaporized into a gas and the metal is exposed to the barrier material gas in an elevated temperature environment. When the barrier material gas compound decomposes, the barrier is left behind on the metal surface.

However, CVD involves considerable process complexity, particularly in the fabrication process for the provision of a barrier layer on top surfaces of metals in damascene structures. Hence, what is needed is a method of fabricating a barrier layer which does not employ CVD and which is cost effective and involves less complexity.

SUMMARY OF THE INVENTION

The present invention is directed to a simplified, CVD-less method of forming a barrier layer for a metal layer which prevents metal contamination in an integrated circuit. The invention utilizes a sacrificial multilayer dielectric structure and selective etching to form the barrier layer. An opening is etched in the structure and a plating layer is deposited in the opening. A first unneeded portion of the structure along with an unneeded portion of the plating layer is removed utilizing an etchant that is selective for the first unneeded structural portion. A metal layer is deposited and implanted with barrier material to form the top barrier layer. A second unneeded portion of the structure along with an unneeded portion of the top barrier layer is removed utilizing an etchant that is selective for the second unneeded structural portion.

The resulting structure is a metal interconnect structure having an overlying top barrier layer which is produced without using CVD techniques.

BRIEF DESCRIPTION OF THE DRAWINGS

The foregoing and other advantages and features of the invention will become more apparent from the detailed description of preferred embodiments of the invention given below with reference to the accompanying drawings in which.

DETAILED DESCRIPTION OF PREFERRED EMBODIMENTS

In the following detailed description, reference is made to various exemplary embodiments for practicing the invention. These embodiments are described with sufficient detail to enable those skilled in the art to practice the invention, and it is to be understood that other embodiments may be employed, and that changes and substitutions may be made without departing from the spirit or scope of the present invention.

The term "substrate" used in the following description may include any semiconductor-based structure that has an exposed silicon surface. Structure must be understood to include silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to substrate in the following description, previous process steps may have been utilized to form regions or junctions in or on the base semiconductor or foundation.

Figure 1:
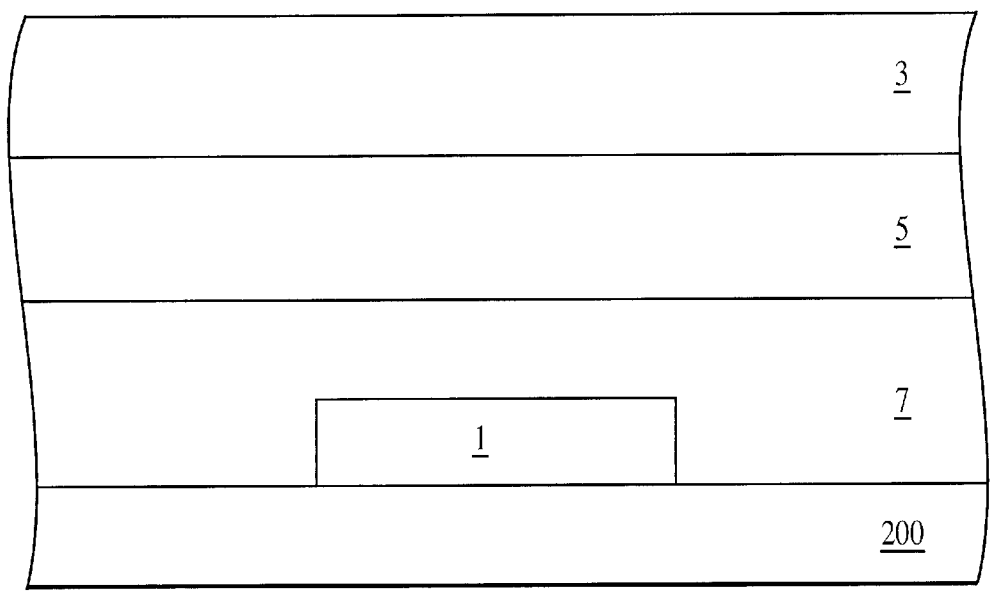
FIGS. 1–6 are cross-sectional views of a structure under fabrication illustrating the process sequences of fabricating a barrier layer in accordance with a first embodiment of the present invention.

A first embodiment of the invention will now be described with reference to FIGS. 1–6. FIG. 1 illustrates a portion of a semiconductor device under fabrication. A conductive layer 1 to which a metal conductor, preferably Cu, is to connect is provided over a substrate 200 which may include a base substrate or a substrate having one or more material layers formed on a base substrate. A first dielectric layer 7 is applied over conductive layer 1 and cured. A preferable first dielectric layer is a polymer. The polymer can be a polyimide or a foamed polyimide. Other dielectric materials may also be used. A second dielectric layer 5 is deposited on top of the first dielectric layer 7. Preferably, the second dielectric layer is silicon dioxide deposited to a thickness of about 500 A. Other dielectric materials may also be used for layer 5. A third dielectric layer 3 is deposited on top of the second dielectric layer 5. The third dielectric layer 3 is preferably silicon nitride and is deposited to a thickness of about 500 A. Once again, other dielectric materials may also be used for layer 3.

Figure 2:
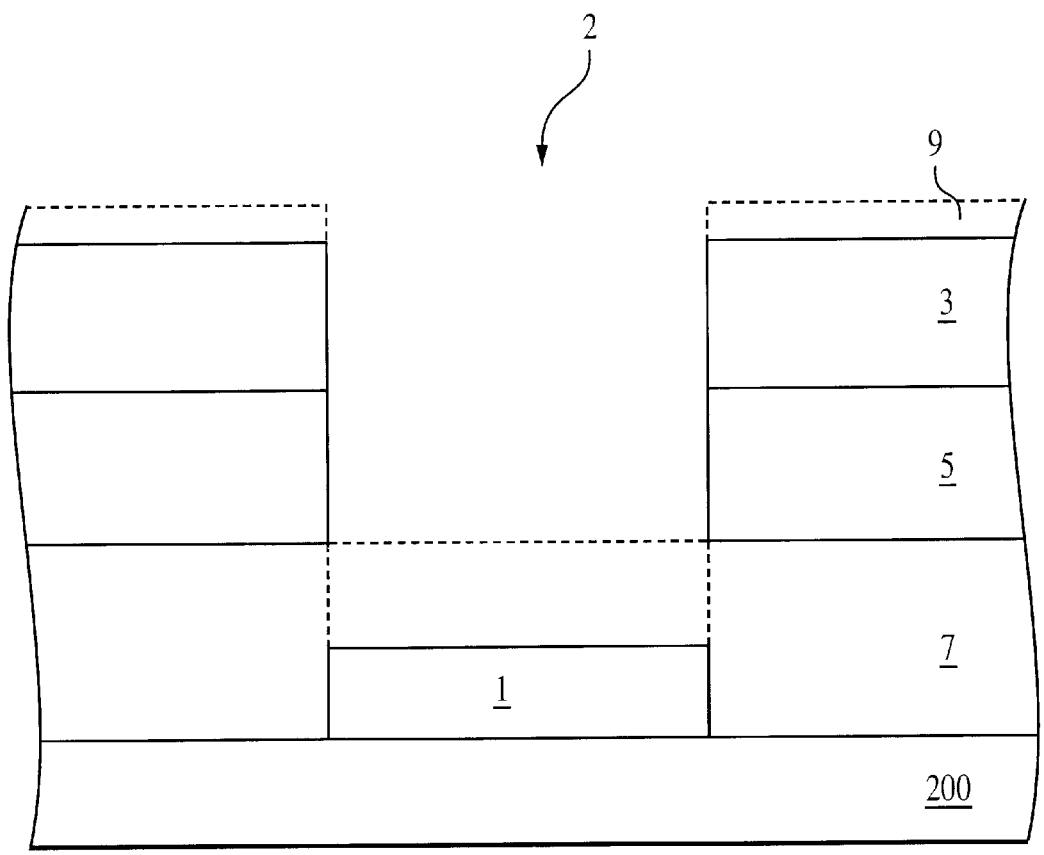

Referring to FIG. 2, a layer of resist 9 is applied, patterned and developed and an opening 2 is etched in the third dielectric layer 3 and second dielectric layer 5 to provide an area for forming a damascene structure. An $O_2$ RIE etch is next used to define an opening in the first dielectric layer 7 down to conductive layer 1. This processing sequence will remove the resist 9 as well.

Figure 3:
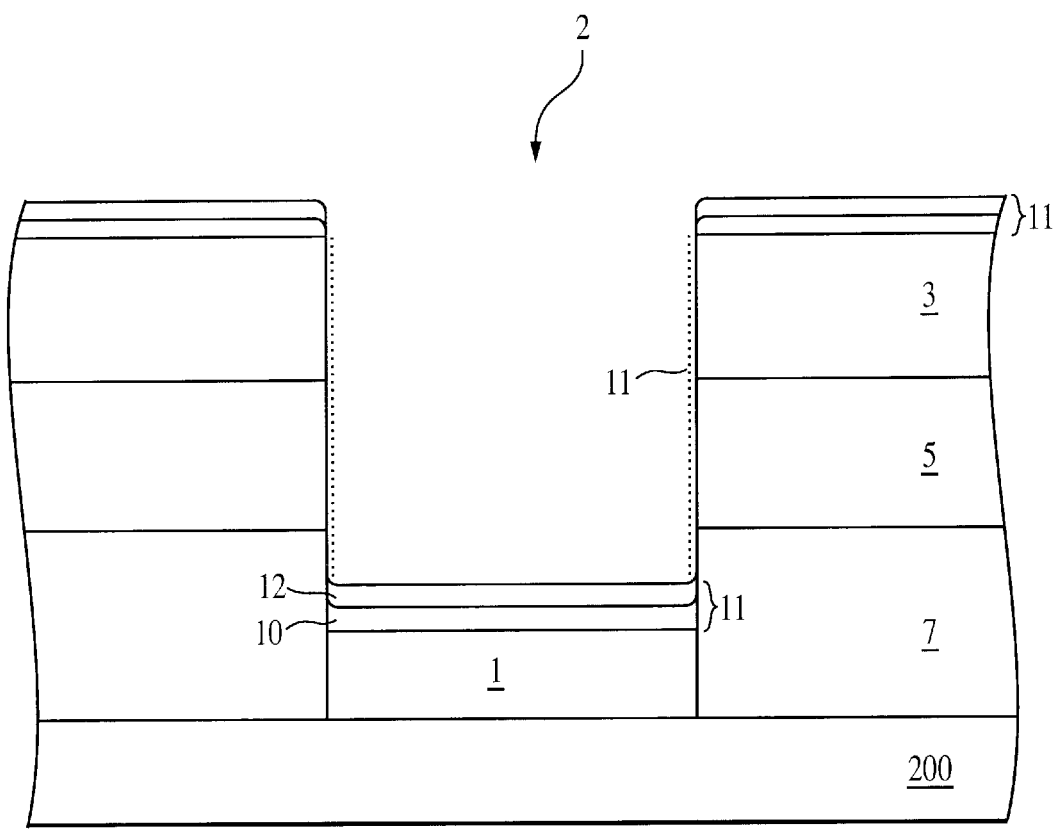

In FIG. 3, the resist layer 9 of FIG. 2 has been removed and the opening 2 has been etched all the way down to conductive layer 1. A plating layer 11 is next deposited in the opening 2 as well as on top of the third dielectric layer 3 for the electroless deposition of the metal, preferably Cu. The plating layer 11 further comprises a first barrier layer 10 and a seed layer 12. The seed layer 12 advantageously serves as a catalyst or base metal for subsequent electroless plating or electroplating of the metal and as an adhesion layer preventing delamination of subsequently electrolessly deposited or electroplated metal. In forming the seed layer of the present invention, any of various refractory metals can be employed, such as tantalum, tungsten, molybdenum, hafnium, niobium, rhenium, osmium, ruthenium, zirconium, titanium, vanadium, chromium and manganese. Preferably, a Cu seed layer is utilized if the metal conductor is copper. Also, in forming the first barrier layer 10 of the present invention, any of various refractory metals can be employed, such as tantalum, tungsten, molybdenum, hafnium, niobium, rhenium, osmium, ruthenium, zirconium, titanium, vanadium, chromium and manganese. It has been found particularly advantageous to employ alloys of Ta or W with N or with certain polyimides, especially those formed from the ester of Zr, TI or Hf.

Figure 4:
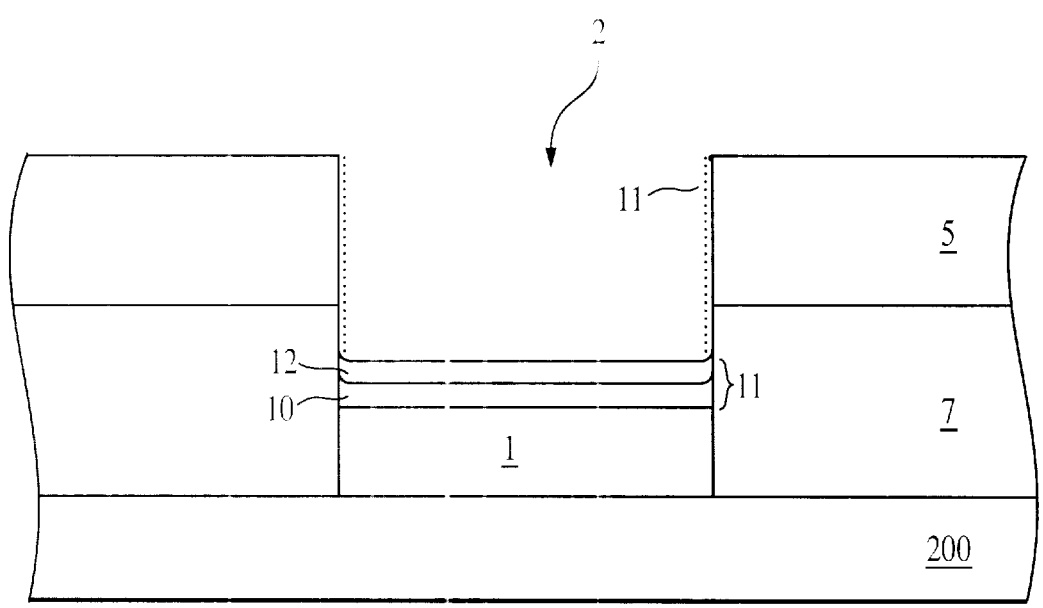

In FIG. 4, the third dielectric layer 3 is removed utilizing an etchant, such as hot phosphoric acid ($H_3PO_4$) at a temperature of about 180° C. and at a etch rate of about 80 A/min., that has a negligible attack on the second dielectric layer 5. Thus, removing the unwanted plating layer 11 from where it was deposited on the third dielectric layer 3 and leaving plating layer 11 extending into the opening 2 up to the top of the second dielectric layer 5.

Figure 5:
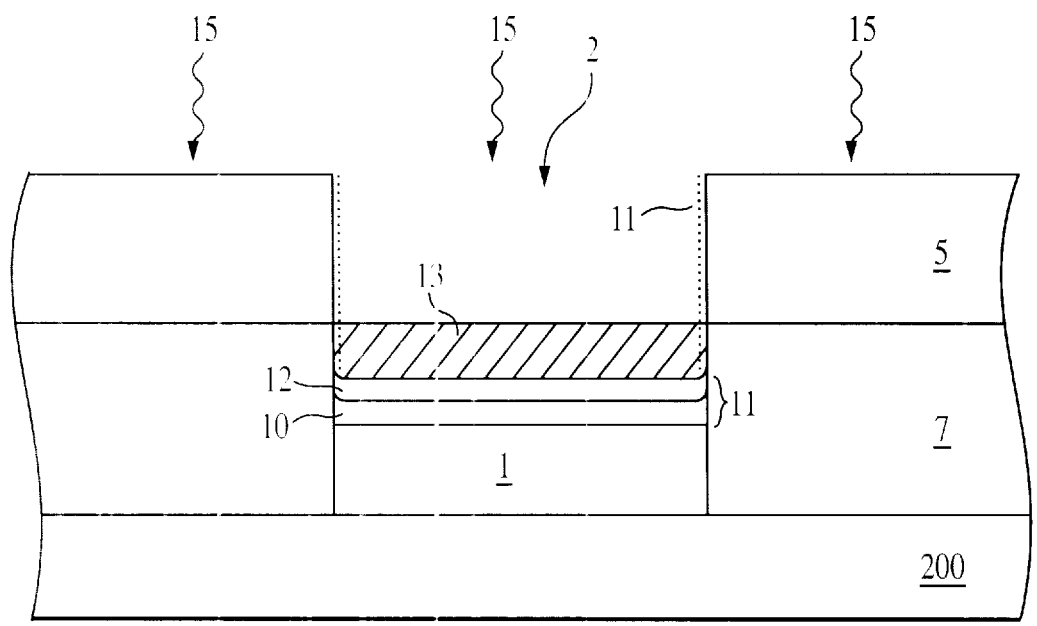

Referring to FIG. 5, a metal layer 13 is next electrolessly plated in opening 2 to a thickness which causes the metal layer 13 to extend to about the level of the top surface of the first dielectric layer 7. Electroless metal deposition is attractive due to low processing costs and high quality metal deposits. In addition, equipment for performing electroless metal deposition is relatively inexpensive compared to other semiconductor processing equipment for depositing metals. Electroless deposition also offers the advantageous opportunity for batch processing of wafers, thereby further reducing the cost of electroless deposition and increasing production throughput.

Figure 6:
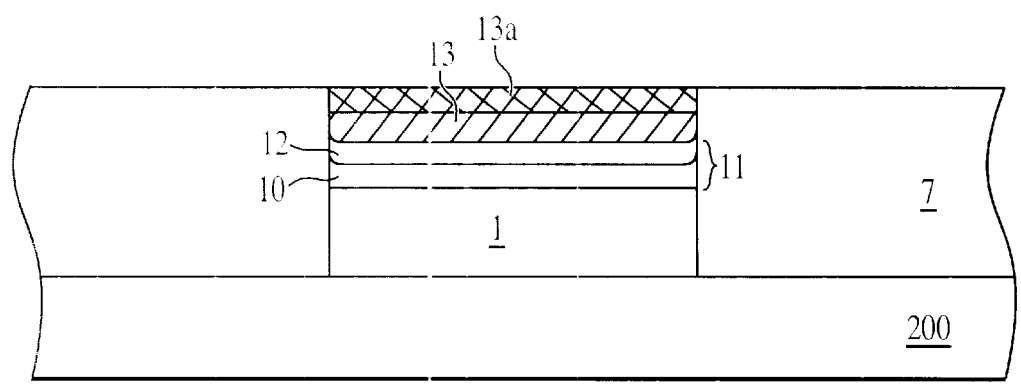
Figure 7:
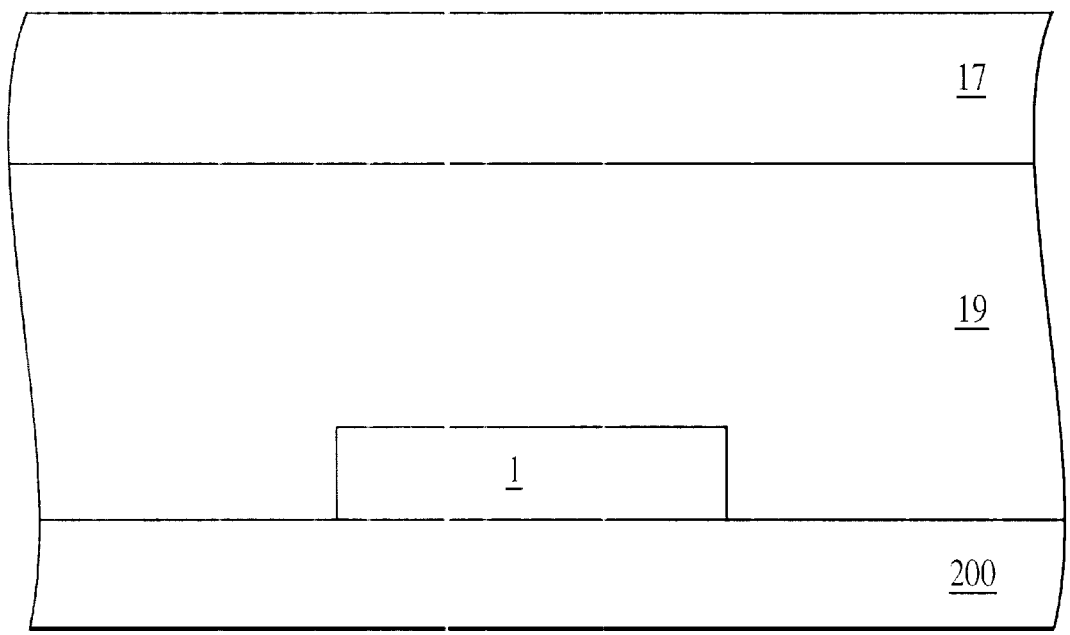
FIGS. 7–12 are cross-sectional views of a structure under fabrication illustrating the process sequences of fabricating a barrier layer in accordance with a second embodiment of the present invention.

The surface of the metal layer 13 is then implanted with dopant 15 to form a top barrier layer 13a to prevent metal contamination. The dopant 15 can be chosen from the group consisting of aluminum, boron, chromium, molybdenum, tungsten, titanium, zirconium, hafnium, magnesium, vanadium, columbium, tantalum or oxides or nitrides of these elements. In one exemplary embodiment, the metal is copper and the dopant is zirconium. The zirconium is implanted at an energy level of about 0.125 keV to 2.0 keV and at a dopant concentration of about $1.25 \times 10^{16}$ ions/cm$^2$ to $2.0 \times 10^{17}$ ions/cm2. Preferably, the zirconium is implanted at an energy of about 0.5 keV and at a concentration of about $5 \times 10^{16}$ ions/cm$^2$. For the other possible dopants, the implant energy and the concentration can be about 0.125 to about 2.0 keV and about $1.25 \times 10^{16}$ to about $2.0 \times 10^{17}$ ions/cm$^2$, respectively without deviating significantly from the spirit of the invention. Preferably, top barrier layer 13a is about 5 A to 40 A thick and more preferably around 20 A thick. The second dielectric layer 5 is next removed by an etchant, such as a mixture of hydroflouric acid (HF) and ammonium fluoride ($NH_4F$) (1:8) at room temperature and at a rate of 700 A/min., which selectively removes the second dielectric layer 5 but not the first dielectric layer 7, as illustrated in FIG. 6. Thus, any dopant, e.g. zirconium, which was implanted into the second dielectric layer 5 during the implant is removed leaving first dielectric layer 7 free of impurities (e.g. zirconium). The resulting top barrier layer 13a can be utilized in an interconnect system for an integrated circuit coupling passive and/or active components such as capacitors, transistors and various memory devices.

Hence, according to the first exemplary embodiment of the present invention, a top barrier layer 13a is formed over a metal layer 13 utilizing a sacrificial multilayer dielectric structure (3, 5) and selective etching of the multilayer structure, plating layer 11 and top barrier layer 13a to remove any unneeded portions.

Figure 8:
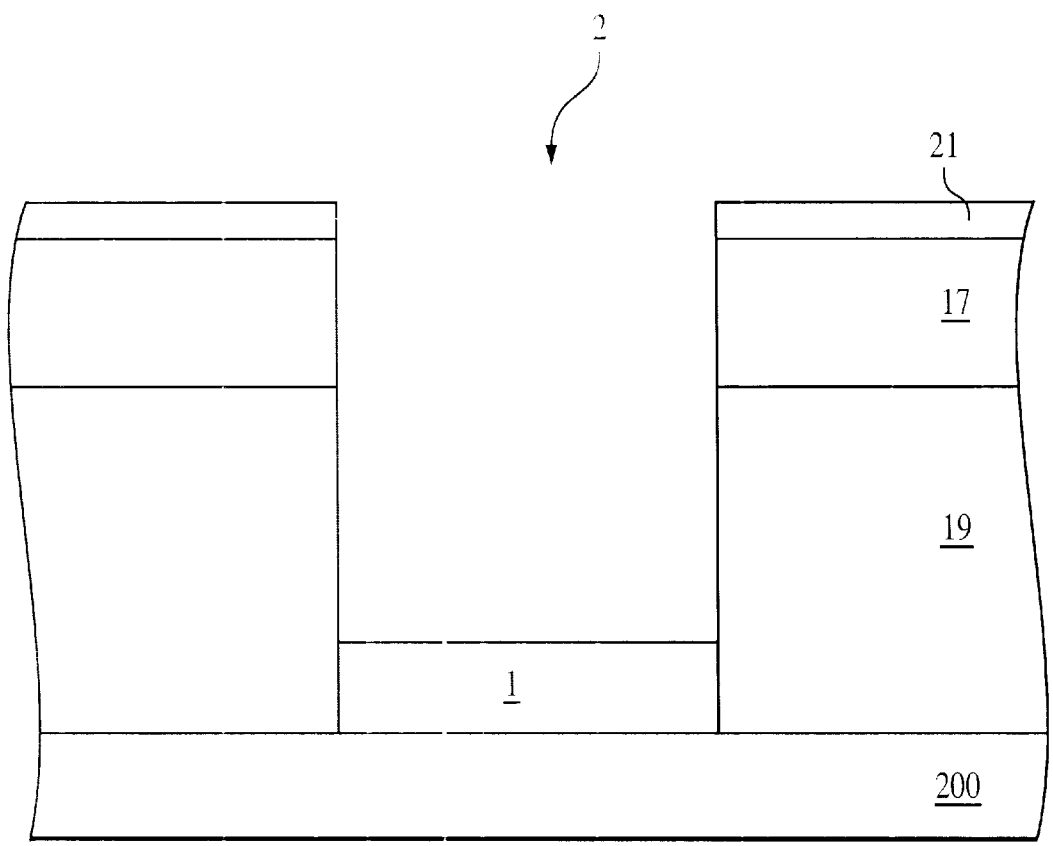
Figure 9:
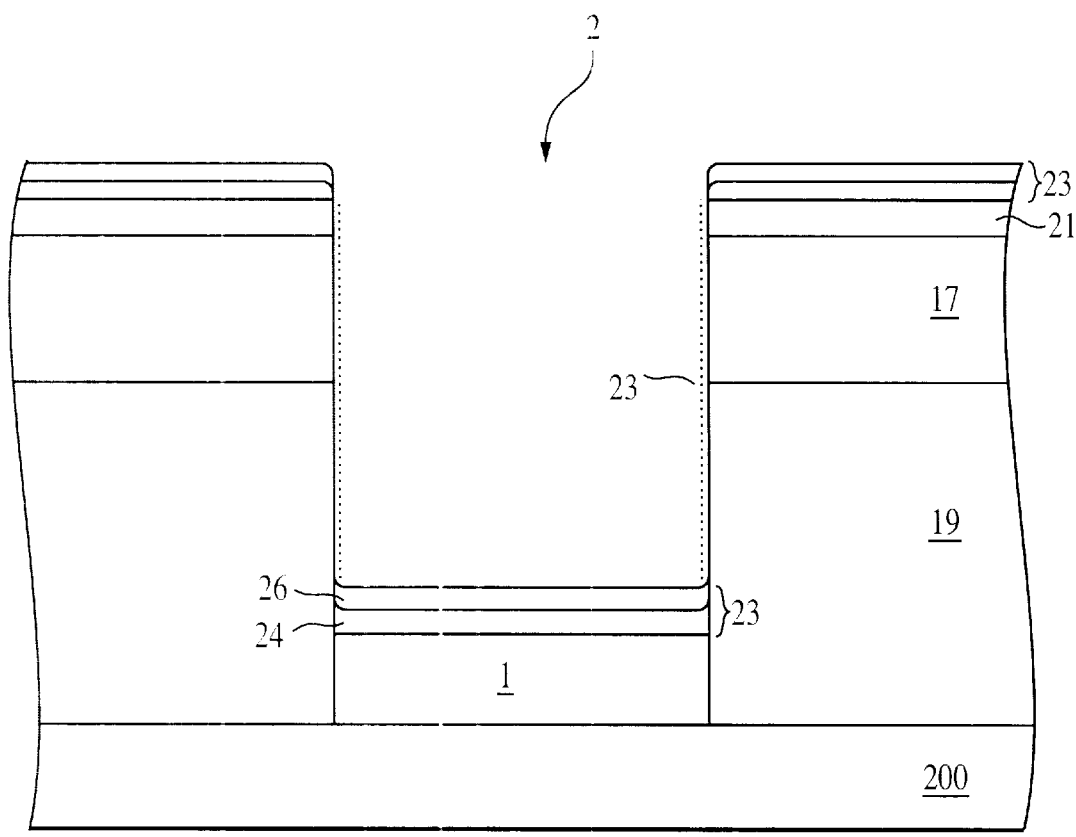

A second embodiment of the invention is illustrated in FIGS. 7–12. In this embodiment, first dielectric layer 19 is deposited over conductive layer 1 in FIG. 7. A preferable first dielectric layer is a silicon dioxide. A second dielectric layer 17 is deposited on top of the first dielectric layer 19. Preferably, the second dielectric layer is silicon nitride and is deposited to a thickness of about 500 A. In FIG. 8, a layer of resist 21 is applied, patterned and developed and an opening 2 is etched in the second dielectric layer 17 and first dielectric layer 19 down to conductive layer 1 to form an opening to produce a damascene structure. In FIG. 9, the resist layer 21 is maintained in place and a plating layer 23 is deposited in the opening 2 as well as on top of the resist layer 21. The plating layer 23 further comprises a first barrier layer 24 and a seed layer 26. The seed layer 26 advantageously serves as a catalyst or base metal for subsequent electroless plating or electroplating of the metal and as an adhesion layer preventing delamination of subsequently electrolessly deposited or electroplated metal. In forming the seed layer of the present invention, any of various refractory metals can be employed, such as tantalum, tungsten, molybdenum, hafnium, niobium, rhenium, osmium, ruthenium, zirconium, titanium, vanadium, chromium and manganese. Preferably, a Cu seed layer is utilized if the metal conductor is copper. Also, in forming the first barrier layer 24 of the present invention, any of various refractory metals can be employed, such as tantalum, tungsten, molybdenum, hafnium, niobium, rhenium, osmium, ruthenium, zirconium, titanium, vanadium, chromium and manganese. It has been found particularly advantageous to employ alloys of Ta or W with N, when silicon dioxide is used as a insulator.

Figure 10:
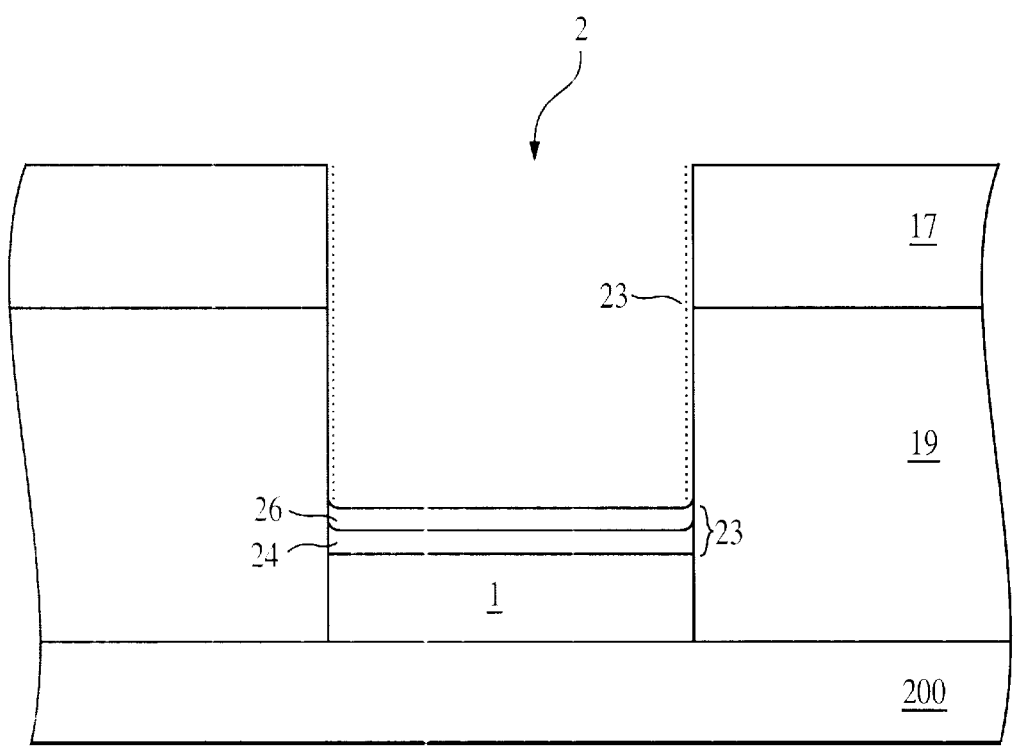

As shown in FIG. 10, the resist layer 21 is next removed utilizing an etchant, such as a mixture of hydroflouric acid (HF) and ammonium fluoride ($NH_4F$) (1:8) at room temperature and at a rate of 700 A/min., that has a negligible attack on the second dielectric layer 17. This removes portions of plating layer 23 from where it was deposited on the resist layer 21, leaving plating layer 23 extending only in the opening 2 up to approximately the level of the top surface of second dielectric layer 17.

Figure 11:
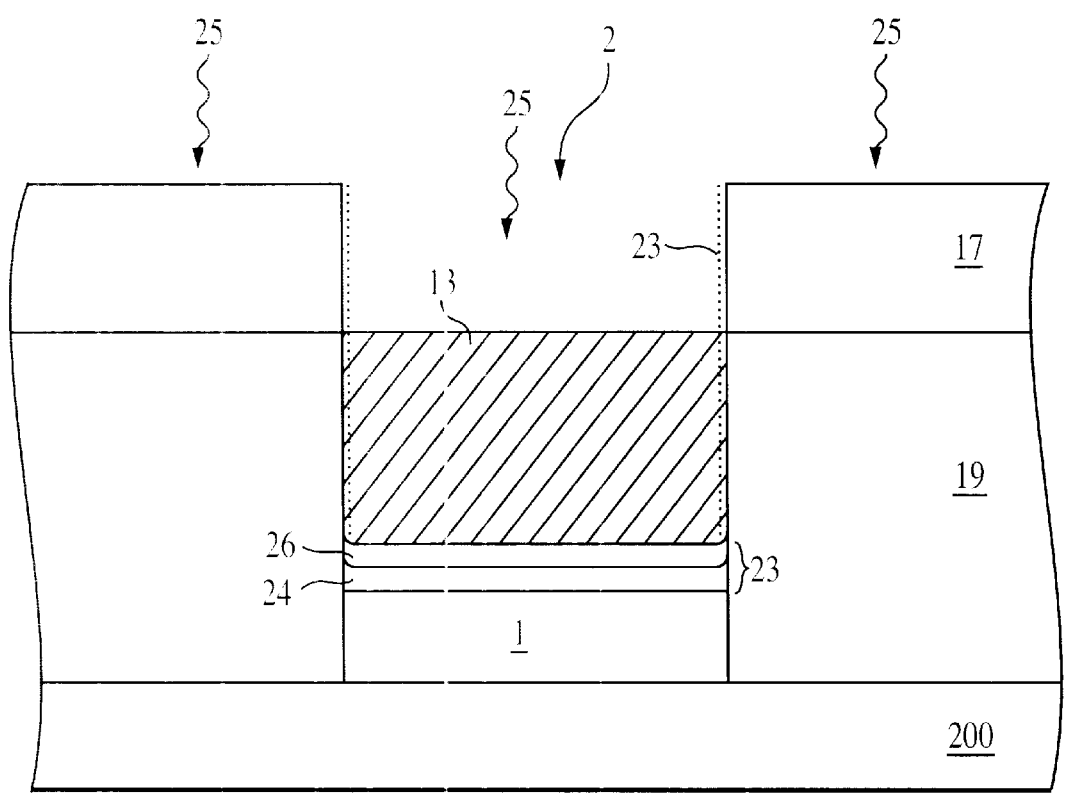
Figure 12:
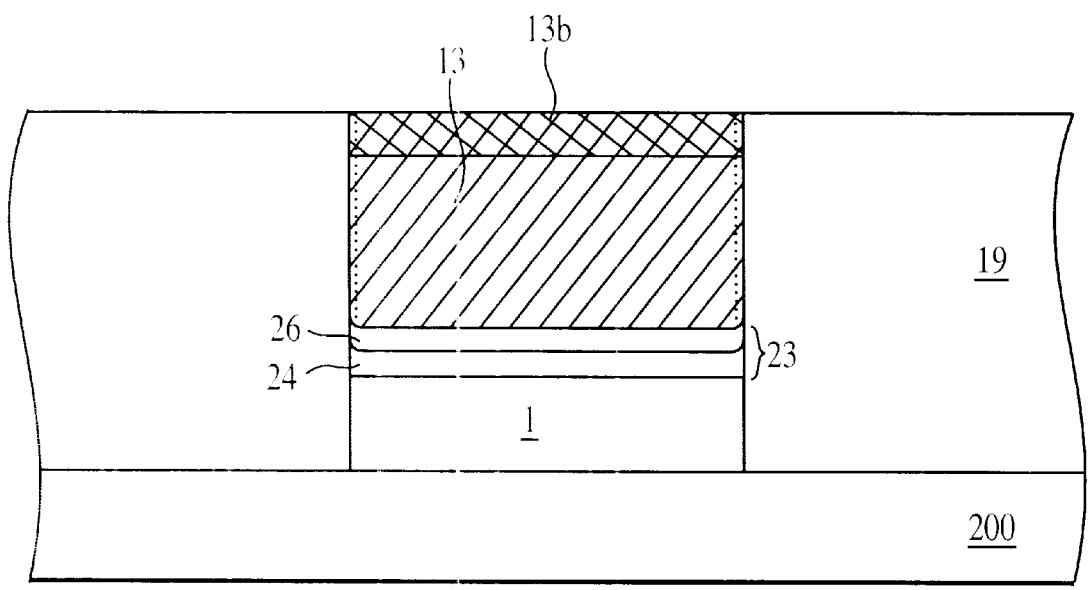

Referring next to FIG. 11, a metal layer 13 is electrolessly plated in opening 2 up to the thickness corresponding to approximately the level of the first dielectric layer 19. The surface of the metal is then implanted with dopant 25. The dopant 25 can be chosen from the group consisting of aluminum, boron, chromium, molybdenum, tungsten, titanium, zirconium, hafnium, magnesium, vanadium, columbium, tantalum or oxides or nitrides of these elements. In one exemplary embodiment, the metal is Cu and the dopant is TaN. The Ta is implanted at a concentration of about $2.5\times10^{16}$ ions/$cm^2$ to $4\times10^{17}$ ions/$cm^2$ and an energy level of about 0.025 keV to 0.4 keV and N is implanted at a concentration of about $2\times10^{16}$ to $3.2\times10^{17}$ ions/$cm^2$ and an energy level of about 0.175 keV to 2.8 keV. Preferably, the Ta is implanted at a concentration of about $10^{17}$ ions/$cm^2$ and energy level of about at 0.1 keV and the N implanted at a concentration of about $8\times10^{16}$ ions/$cm^2$ and an energy level of about 0.7 keV. For the other possible dopants, the implant energy and the concentration can be about 0.125 to about 2.0 keV and about $1.25\times10^{16}$ to about $2.0\times10^{17}$ ions/$cm^2$, respectively without deviating significantly from the spirit of the invention. The product of the Ta and N implants forms a TaN barrier layer 13b, shown in FIG. 12. Preferably, top barrier layer 13a is bout 5 A to 40 A thick and more preferably about 20 A thick. The second dielectric layer 17 is next removed by an etchant, such as hot phosphoric acid ($H_3PO_4$) at a temperature of about 180° C. and at a etch rate of about 80 A/min., which selectively attacks the second dielectric layer and not the first dielectric layer as illustrated in FIG. 12. Thus, any TaN dopants which were implanted into the second dielectric layer 17 are removed leaving first dielectric layer 19 free of impurities (i.e. TaN). Also, the remaining part of the plating layer 23 is removed along with the removal of the second dielectric layer 17. The resulting top barrier layer 13a can be utilized in an interconnect system for an integrated circuit coupling passive and/or active components such as capacitors, transistors and various memory devices.

Hence, according to the second embodiment of the present invention, a top barrier layer 13a is formed over a copper plug 13 utilizing a sacrificial multilayer dielectric structure and selective etching of the structure, plating layer and the top barrier layer to remove any unneeded portions. A top barrier layer for a metal conductor is formed in accordance with the invention without the need for CVD or CMP processing steps.

While certain embodiments of the invention have been described and illustrated above, the invention is not limited to these specific embodiments as numerous modifications, changes and substitutions of equivalent elements can be made without departing from the spirit and scope of the invention. Accordingly, the scope of the present invention is not to be considered as limited by the specifics of the particular methods which have been described and illustrated, but is only limited by the scope of the appended claims.

What is claimed as new and desired to be protected by Letters Patent of the United States is:

1. A method of fabricating a conductor layer and associated barrier layer, said method comprising:

forming an opening extending through a multilayer dielectric comprising a top layer comprising a first dielectric material, an intermediate layer comprising a second dielectric material and a bottommost layer comprising a third dielectric material, said opening extending through said top and intermediate layers and through at least a portion of said bottommost layer;

depositing a plating layer over said top dielectric layer and at the bottom of said opening;

removing said top dielectric layer and a portion of said plating layer which is deposited on said top dielectric layer;

depositing a conductor layer over said plating layer;

doping an upper surface of said conductor layer with a dopant; and removing said intermediate dielectric layer and a portion of said plating layer which extends above said bottommost dielectric layer.

2. The method of claim 1 wherein said top layer comprises silicon nitride.

3. The method of claim 1 wherein said intermediate layer comprises silicon dioxide.

4. The method of claim 1 wherein said bottommost layer comprises a polymer.

5. The method of claim 4 wherein said bottommost layer is a polyimide.

6. The method of claim 1 wherein said top layer is silicon nitride, said intermediate layer is silicon dioxide and said bottommost layer is a polyimide.

7. The method of claim 1 wherein said top layer is a resist.

8. The method of claim 1 wherein said intermediate layer is a silicon nitride.

9. The method of claim 1 wherein said bottommost layer is silicon dioxide.

10. The method of claim 1 wherein said top layer is a resist, said intermediate layer is silicon nitride and said bottommost layer is silicon dioxide.

11. The method of claim 1 wherein said plating layer further comprises a seed layer on top of a first barrier layer.

12. The method of claim 1 wherein said conductor layer is deposited to a thickness about equal to a thickness of the bottommost dielectric layer.

13. The method of claim 1 wherein said doping is performed by ion implantation.

14. The method of claim 13 wherein said ion implantation is performed at an implant energy of about 0.125 to 2.0 keV.

15. The method of claim 13, wherein said ion implantation is performed at a dopant concentration of about $1.25 \times 10^{16}$ to about $2.0 \times 10^{17}$ ions/cm$^2$.

16. The method of claim 1 wherein said dopant is selected from the group consisting of aluminum, boron, chromium, molybdenum, tungsten, titanium, zirconium, hafnium, magnesium, vanadium, columbium, tantalum and oxides and nitrides of said elements.

17. The method of claim 1 wherein said conductor layer comprises copper.

18. The method of claim 1 wherein said conductor layer comprises metal.

19. The method of claim 1 wherein said conductor layer is deposited by electroless plating.

20. The method of claim 1 wherein said dopant is zirconium.

21. The method of claim 20 wherein said zirconium is implanted at an energy level of about 0.125 keV to 2.0 keV and at a dopant concentration of about $1.25 \times 10^{16}$ ions/cm$^2$ to $2.0 \times 10^{17}$ ions/cm$^2$.

22. The method of claim 20 wherein said zirconium is implanted at an energy level of about 0.5 keV and at a dopant concentration of about $5 \times 10^{16}$ ions/cm$^2$.

23. The method of claim 1 wherein said dopant is TaN.

24. The method of claim 23 wherein Ta is implanted at a concentration of about $2.5 \times 10^{16}$ ions/cm$^2$ to $4 \times 10^{17}$ ions/cm$^2$ and an energy level of about 0.025 keV to 0.4 keV and N is implanted at a concentration of about $2 \times 10^{16}$ to $3.2 \times 10^{17}$ ions/cm$^2$ and an energy level of about 0.175 keV to 2.8 keV.

25. The method of claim 23 wherein Ta is implanted at a concentration of about $10^{17}$ ions/cm$^2$ and an energy level of about at 0.1 keV and N is implanted at a concentration of about $8 \times 10^{16}$ ions/cm$^2$ and an energy level of about 0.7 keV.

26. The method of claim 1 wherein said barrier layer and conductor layer are utilized in an integrated circuit interconnect structure.

27. A method of fabricating a conductor layer and associated barrier layer, said method comprising:
   forming an opening through a multilayer dielectric comprising a top silicon nitride layer, an intermediate silicon dioxide layer and a bottommost polymer layer;
   depositing a plating layer over said top dielectric layer and at the bottom of said opening;
   removing said top dielectric layer and a portion of said plating layer which is deposited on said top dielectric layer;
   depositing a conductor layer over said plating layer;
   doping an upper surface of said conductor layer with zirconium; and
   removing said intermediate dielectric layer and a portion of said plating layer which extends above said bottommost dielectric layer.

28. The method of claim 27 wherein said bottommost layer is a polyimide.

29. The method of claim 27 wherein said plating layer further comprises a seed layer on top of a first barrier layer.

30. The method of claim 27 wherein said conductor layer is deposited to a thickness about equal to a thickness of the bottommost dielectric layer.

31. The method of claim 27 wherein said doping is performed by ion implantation.

32. The method of claim 27 wherein said conductor is layer comprises copper.

33. The method of claim 27 wherein said conductor layer is deposited by electroless plating.

34. The method of claim 31 wherein said zirconium is implanted at an energy level of about 0.125 keV to 2.0 keV and at a dopant concentration of about $1.25 \times 10^{16}$ ions/cm$^2$ to $2.0 \times 10^{17}$ ions/cm$^2$.

35. The method of claim 31 wherein said zirconium is implanted at an energy level of about 0.5 keV and at a dopant concentration of about $5 \times 10^{16}$ ions/cm$^2$.

36. The method of claim 27 wherein said barrier layer and conductor layer are utilized in an integrated circuit interconnect structure.

37. A method of fabricating a conductor layer and associated barrier layer, said method comprising:
   forming an opening through a multilayer dielectric comprising a top resist layer, an intermediate silicon nitride layer and a bottommost silicon dioxide layer;
   depositing a plating layer over said top dielectric layer and in said opening;
   removing said top dielectric layer and a portion of said plating layer which is deposited on said top dielectric layer;
   depositing a conductor in said opening;
   doping an upper surface of said conductor with TaN; and
   removing said intermediate dielectric layer and a portion of said plating layer which extends above said bottommost dielectric layer.

38. The method of claim 37 wherein said plating layer further comprises a seed layer on top of a first barrier layer.

39. The method of claim 37 wherein said conductor is deposited to a thickness about equal to a thickness of the bottommost dielectric layer.

40. The method of claim 37 wherein said doping is performed by ion implantation.

41. The method of claim 37 wherein said conductor is copper.

42. The method of claim 37 wherein said conductor is deposited by electroless plating.

43. The method of claim 40 wherein Ta is implanted at a concentration of about $2.5 \times 10^{16}$ ions/cm$^2$ to $4 \times 10^{17}$ ions/cm$^2$ and an energy level of about 0.025 keV to 0.4 keV and N is implanted at a concentration of about $2 \times 10^{16}$ to $3.2 \times 10^{17}$ ions/cm$^2$ and an energy level of about 0.175 keV to 2.8 keV.

44. The method of claim 40 wherein Ta is implanted at a concentration of about $10^{17}$ ions/cm$^2$ and an energy level of about at 0.1keV and N is implanted at a concentration of about $8 \times 10^{16}$ ions/cm$^2$ and an energy level of about 0.7 keV.

45. The method of claim 37 wherein said barrier layer and conductor are utilized in an integrated circuit interconnect structure.

* * * * *